(12) United States Patent
Lee et al.

(10) Patent No.: US 11,531,588 B2
(45) Date of Patent: Dec. 20, 2022

(54) ERROR CORRECTION CIRCUIT AND METHOD FOR OPERATING THE SAME

(71) Applicant: Samsung Electronics Co., Ltd., Suwon-si (KR)

(72) Inventors: Kangseok Lee, Seoul (KR); Dong-min Shin, Seoul (KR); Geunyeong Yu, Seongnam-si (KR); Bohwan Jun, Seoul (KR); Hee Youl Kwak, Suwon-si (KR); Hong Rak Son, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/480,560

(22) Filed: Sep. 21, 2021

(65) Prior Publication Data

US 2022/0004458 A1 Jan. 6, 2022

Related U.S. Application Data

(63) Continuation of application No. 16/914,890, filed on Jun. 29, 2020, now Pat. No. 11,175,985.

(30) Foreign Application Priority Data

Nov. 19, 2019 (KR) ........................ 10-2019-0148739

(51) Int. Cl.
*G06F 11/10* (2006.01)
*H03M 13/35* (2006.01)
(Continued)

(52) U.S. Cl.
CPC ...... *G06F 11/1068* (2013.01); *G06F 11/1032* (2013.01); *G06F 11/1048* (2013.01);
(Continued)

(58) Field of Classification Search
CPC ............ G06F 11/1068; G06F 11/1032; G06F 11/1048; H03M 13/1102; H03M 13/112;
(Continued)

(56) References Cited

U.S. PATENT DOCUMENTS 7,281,192 B2 10/2007 Shen et al.
8,762,806 B2 * 6/2014 Chin .................... H03M 13/116
714/751
(Continued)

OTHER PUBLICATIONS

F. Mattoussi 'Design and optimization of AL-FEC codes: the GLDPC-Staircase codes' *HAL archive*, 2014, pp. 1-167.
(Continued)

*Primary Examiner* — John J Tabone, Jr.
(74) *Attorney, Agent, or Firm* — Harness, Dickey & Pierce, P.L.C.

(57) ABSTRACT

An error correction circuit includes a memory that stores at least one decoding parameter, a low density parity check (LDPC) decoder that includes a first variable node storing one bit of the data, receives the at least one decoding parameter from the memory, decides a degree of the first variable node based on the at least one decoding parameter, and decides a decoding rule necessary for decoding of the one bit based on the degree of the first variable node, and an adaptive decoding controller that outputs corrected data based on a decoding result of the LDPC decoder.

20 Claims, 12 Drawing Sheets

(51) Int. Cl.
*H03M 13/11* (2006.01)
*H03M 13/37* (2006.01)

(52) U.S. Cl.
CPC ...... *H03M 13/112* (2013.01); *H03M 13/1102* (2013.01); *H03M 13/114* (2013.01); *H03M 13/1131* (2013.01); *H03M 13/35* (2013.01); *H03M 13/3707* (2013.01); *H03M 13/3715* (2013.01); *H03M 13/3723* (2013.01)

(58) Field of Classification Search
CPC ........... H03M 13/1131; H03M 13/114; H03M 13/35; H03M 13/3707; H03M 13/3715; H03M 13/3723
USPC ....... 714/764, 768, 769, 773, 774, 782, 786, 714/799
See application file for complete search history.

(56) References Cited

U.S. PATENT DOCUMENTS

| | | | |
|---|---|---|---|
| 9,866,241 B2 | 1/2018 | Yen et al. | |
| 10,110,249 B2 | 10/2018 | Zhang et al. | |
| 2009/0013239 A1 | 1/2009 | Blanksby | |
| 2011/0087946 A1* | 4/2011 | Planjery | H03M 13/6577 |
| | | | 714/752 |
| 2011/0264986 A1* | 10/2011 | Chin | H03M 13/116 |
| | | | 714/763 |
| 2014/0082449 A1 | 3/2014 | Zhang | |
| 2014/0372825 A1* | 12/2014 | Jeong | H03M 13/2906 |
| | | | 714/752 |
| 2014/0372826 A1* | 12/2014 | Myung | H03M 13/1165 |
| | | | 714/752 |
| 2015/0058692 A1 | 2/2015 | Bennatan et al. | |
| 2015/0236884 A1* | 8/2015 | Suh | H04H 20/33 |
| | | | 375/295 |
| 2016/0344411 A1* | 11/2016 | Jeong | H03M 13/1185 |
| 2016/0344412 A1* | 11/2016 | Jeong | H03M 13/1165 |
| 2018/0041227 A1* | 2/2018 | Lee | H03M 13/2948 |
| 2018/0175889 A1 | 6/2018 | Bazarsky et al. | |
| 2019/0044537 A1 | 2/2019 | Reynwar et al. | |
| 2019/0363825 A1* | 11/2019 | Radosevic | H03M 13/2957 |

OTHER PUBLICATIONS

Olmos etr al. 'A Scaling Law to Predict the Finite-Length Performance of Spatially-Coupled LDPC Codes' *IEEE,* 2014, pp. 1-15.
Yang et al. 'Doped Accumulate LT Codes' *IEEE,* 2007, pp. 2001-2005.
Notice of Allowance dated Jul. 23, 2021, issued in corresponding U.S. Appl. No. 16/914,890.

* cited by examiner

ERROR CORRECTION CIRCUIT AND METHOD FOR OPERATING THE SAME

CROSS-REFERENCE TO RELATED APPLICATIONS

This is a continuation of U.S. application Ser. No. 16/914,890, filed Jun. 29, 2020, which claims priority to Korean Application No. 10-2019-0148739, filed on Nov. 19, 2019, the disclosures of each of which are hereby incorporated by reference in their entirety.

BACKGROUND

Example embodiments of inventive concepts disclosed here relate to an electronic device, and more particularly, relate to an error correction circuit and/or a method for operating the error correction circuit.

A semiconductor memory supports a write operation for storing data and a read operation for reading the stored data. An error may occur while data is being written in the semiconductor memory, while data is being stored in the semiconductor memory, and/or while data is being read from the semiconductor memory. Various error correction methods for correcting the error are being developed.

A low density parity check (LDPC) method is one of error correction methods that have been developed in recent years. The LDPC method has a high complexity of calculation. To make the complexity of the LDPC method low, there are various attempts to approximate the LDPC method. However, approximating the LDPC method may cause an increase in an error floor associated with the LDPC method.

SUMMARY

Examples of inventive concepts provide an error correction circuit having a low error floor and an operating method of the error correction circuit. The error floor may correspond to a floor in a plot of a signal-to-noise ratio (SNR) vs. a bit-error rate (BER), indicating a lack of decrease in BER in relation to an improvement in SNR.

According to some example embodiments, an error correction circuit may include a memory configured to store at least one decoding parameter, and a processing circuit including a first variable node configured to store one bit of the data, the processing circuit configured to receive the at least one decoding parameter from the memory, to determine a graph-degree of the first variable node based on the at least one decoding parameter, and to determine a decoding rule for decoding of the one bit based on the graph-degree of the first variable node, the processing circuit further configured to output corrected data based on a decoding result.

According to some example embodiments, a method for operating an error correction circuit may include performing decoding on variable nodes having a first graph-degree value, in a first time period, performing decoding on the variable nodes having a second graph-degree value, in a second time period following the first time period, and outputting corrected data based on a result of decoding on the variable nodes having the first and second graph-degree values.

According to some example embodiments, a method for operating an error correction circuit may include performing decoding on variable nodes having a first graph-degree value, in a first iteration, performing decoding on the variable nodes having a second graph-degree value, in a second iteration following the first iteration, and outputting corrected data based on a result of decoding on the variable nodes having the first and second graph-degree values.

BRIEF DESCRIPTION OF THE FIGURES

The above and other objects and features of inventive concepts will become apparent by describing in detail example embodiments thereof with reference to the accompanying drawings.

DETAILED DESCRIPTION OF EXAMPLE EMBODIMENTS

Below, embodiments of inventive concepts may be described in detail and clearly to such an extent that an ordinary one in the art easily implements inventive concepts.

Figure 1:
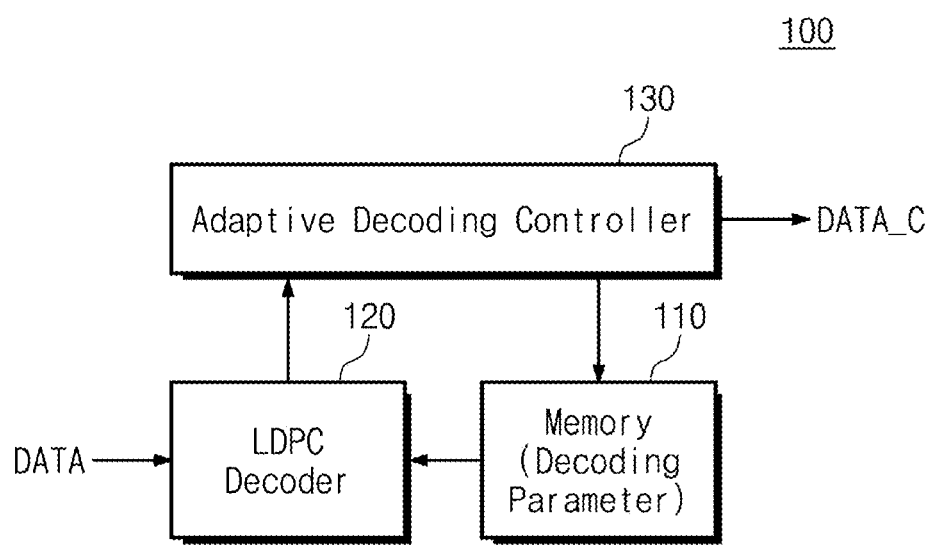
FIG. 1 is a block diagram illustrating an error correction circuit according to some example embodiments of inventive concepts.

FIG. 1 is a block diagram illustrating an error correction circuit 100 according to some example embodiments of inventive concepts. Referring to FIG. 1, the error correction circuit 100 includes a memory 110, a low density parity check (LDPC) decoder 120, and an adaptive decoding controller 130. Any or all of the elements of FIG. 1 may collectively be referred to as processing circuitry or as a processing circuit, and may be implemented with hardware, for example with hardware including CMOS logic gates. For example, the LDPC decoder 120 and the adaptive decoding controller 130 may be referred to as processing circuitry and/or as a processing circuit.

The memory 110 may store a decoding parameter used in, e.g. necessary for, the LDPC decoder 120 to perform error correction decoding (e.g., LDPC decoding). When the LDPC decoder 120 requires the decoding parameter, the memory 110 may provide the decoding parameter to the LDPC decoder 120.

Figure 12:
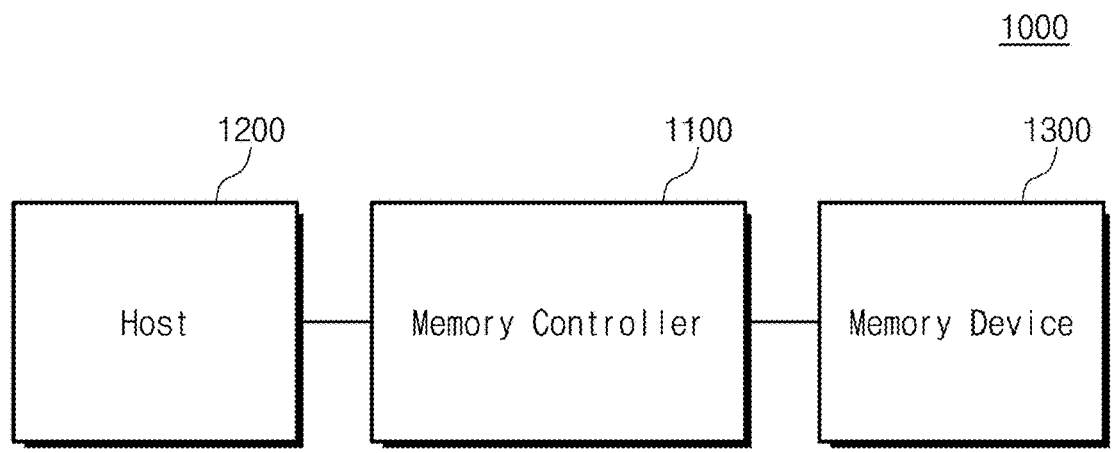
FIG. 12 illustrates a memory system according to some example embodiments of inventive concepts.

The LDPC decoder 120 may receive data "DATA" from a first external device (e.g., a memory device 1300 of FIG. 12). The LDPC decoder 120 may receive the decoding parameter from the memory 110. The LDPC decoder 120 may perform the error correction decoding (e.g., the LDPC decoding) on the data "DATA", based on the decoding parameter.

For example, the LDPC decoder 120 may repeatedly perform the LDPC decoding including check node update and variable node update. The LDPC decoder 120 may transfer a result of the LDPC decoding to the adaptive decoding controller 130. For example, when LDPC decoding is repeatedly performed, the LDPC decoder 120 may transfer a result of each of the LDPC decoding operations to the adaptive decoding controller 130.

The adaptive decoding controller 130 may receive a result of the LDPC decoding from the LDPC decoder 120. When the LDPC decoding result indicates that no error exists, the adaptive decoding controller 130 may output error-corrected data DATA_C to a second external device (e.g., a host 1200 of FIG. 12). When the LDPC decoding result indicates that an error exists, the adaptive decoding controller 130 may calculate an error rate of the LDPC decoding result and may control the memory 110 based on the error rate.

For example, the adaptive decoding controller 130 may allow the memory 110 to output a decoding parameter that varies. For example, the decoding parameter may vary depending on the error rate. For example, the adaptive decoding controller 130 may transfer, to the memory 110, an address of a storage area in which a decoding parameter that the memory 110 will transfer to the LDPC decoder 120 is stored and may change an address depending on the error rate.

Figure 2:
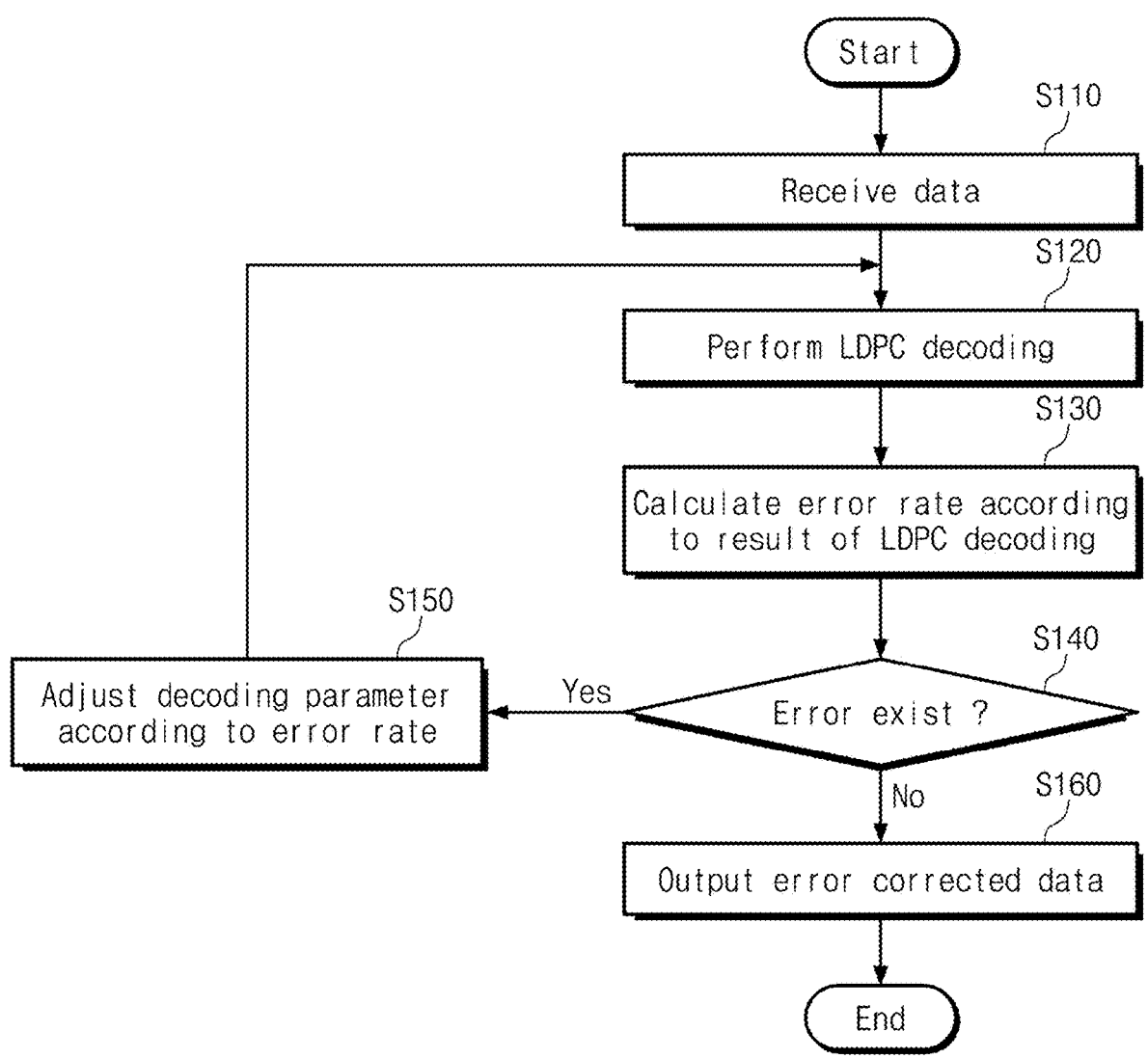
FIG. 2 is a flowchart illustrating an operating method of an error correction circuit according to some example embodiments of inventive concepts.

FIG. 2 is a flowchart illustrating an operating method of the error correction circuit 100 according to some example embodiments of inventive concepts. In some example embodiments, an example in which the error correction circuit 100 corrects an error of bits corresponding to one error correction unit is illustrated in FIG. 2. Referring to FIGS. 1 and 2, in operation S110, the LDPC decoder 120 of the error correction circuit 100 may receive the data "DATA" from the first external device (e.g., the memory device 1300 of FIG. 12).

The data "DATA" may have a length (e.g., a number of bits, a number of samples, or a number of symbols) corresponding to an error correction unit by which the error correction circuit 100 is capable of correcting an error once. In operation S120, the LDPC decoder 120 of the error correction circuit 100 may perform the LDPC decoding on the received data "DATA".

For example, the LDPC decoder 120 may perform the LDPC decoding based on the decoding parameter received from the memory 110. The LDPC decoding may include check node update and variable node update. The LDPC decoder 120 may transfer a result of the LDPC decoding to the adaptive decoding controller 130. In operation S130, the adaptive decoding controller 130 of the error correction circuit 100 may calculate an error rate depending on the LDPC decoding result. For example, the adaptive decoding controller 130 may calculate an error rate of values of updated variable nodes.

When the error correction circuit 100 determines in operation S140 that an error exists, operation S150 is performed. In operation S150, the adaptive decoding controller 130 of the error correction circuit 100 may adjust the decoding parameter depending on the error rate. For example, the adaptive decoding controller 130 may allow the memory 110 to output a decoding parameter varying depending on the error rate. Afterwards, the LDPC decoding may be repeated from operation S120. When the error correction circuit 100 determines in operation S140 that no error exists, operation S160 is performed. In operation S160, the adaptive decoding controller 130 may output the error-corrected data DATA_C to the second external device (e.g., the host 1200 of FIG. 12).

To sum up, the error correction circuit 100 according to some example embodiments of inventive concepts may repeatedly perform the LDPC decoding and may adjust a decoding parameter for performing future LDPC decoding (e.g., next LDPC decoding) depending of an error rate of a result of each of the LDPC decoding operations. A decoding parameter may be adjusted to further decrease an error floor of the error correction circuit 100. Accordingly, the error floor of the error correction circuit 100 may decrease, and a BER may further decrease with increasing SNR.

Figure 3:
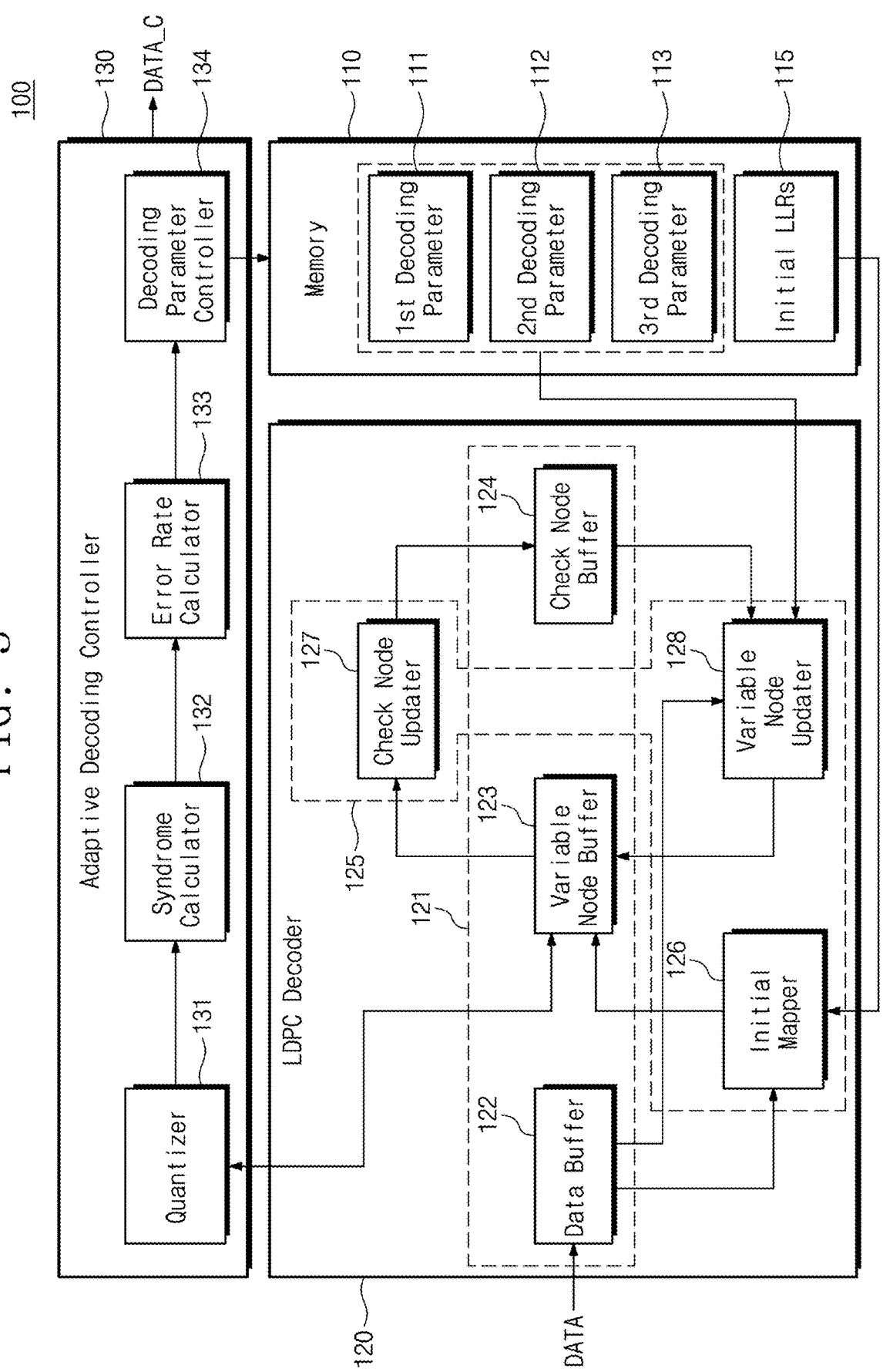
FIG. 3 illustrates an error correction circuit according to some example embodiments of inventive concepts in detail.

FIG. 3 illustrates the error correction circuit 100 according to some example embodiments of inventive concepts in detail. Referring to FIG. 3, the memory 110 may store first to third decoding parameters 111 to 113 and initial log-likelihood ratio (LLR) values 115. Each of the first to third decoding parameters 111 to 113 may include information used/necessary for the LDPC decoder 120 to perform the LDPC decoding.

The decoding parameter may include information about a decoding rule corresponding to graph-theoretical degrees (graph-degrees) of variable nodes, a decoding order of variable nodes decided depending on degrees of the variable nodes, and information about variable nodes targeted for decoding in each of iterations.

The decoding rules may include at least one of a sum-based rule, a lookup table (LUT)-based rule, or similar rules. The sum-based rule may include at least one of an operation of adding values stored at variable nodes, an operation of calculating an exponential function value or a hyperbolic function value of values obtained by adding the values stored at the variable nodes, etc. The LUT-based rule may include an operation of outputting a result corresponding to the values stored at the variable nodes based on a lookup table stored in a memory (e.g., the memory 110 of FIG. 1 or 2).

The decoding order of the variable nodes may be decided/determined within respective iterations for decoding. The decoding order decided depending on orders of the variable nodes may include the order of performing decoding from a variable node having the highest connectivity, e.g. the highest graph-degree to a variable node having the lowest connectivity, e.g. the lowest graph-degree (a descending order from highest to lowest graph-degrees), the order of performing decoding from a variable node having the lowest graph-degree to a variable node having the highest graph-degree (an ascending order from lowest to highest graph-degrees), the order of preferentially performing decoding on a variable node having a graph-degree decided in advance for respective iterations and then performing decoding the remaining variable nodes, etc. Herein, check nodes may correspond to constraint nodes that code-words are to satisfy, while variable nodes may correspond to bits associated with data. There may be a bipartite relation between variable nodes and check nodes. For example, there may be a bipartite graph with (directed) edges connecting each variable node to many check nodes. A graph-degree of a variable node may be or correspond to a number of edges between the variable node and corresponding check nodes. For example a graph-degree of a variable node may correspond to a number of check nodes to which the variable node is connected.

The LDPC decoder 120 may decide variable nodes targeted for decoding in respective iterations depending on graph-degrees of variable nodes. For example, the LDPC decoder 120 may perform decoding only on a variable node having the highest connectivity/graph-degree in the first iteration and may perform decoding on all the variable nodes in the remaining iterations. For another example, the LDPC decoder 120 may perform decoding on variable nodes having at least one graph-degree decided/determined in advance, for respective iterations.

The memory 110 may provide one of the first to third decoding parameters 111 to 113 to the LDPC decoder 120 under control of the adaptive decoding controller 130 and/or in response to a request of the LDPC decoder 120. In some example embodiments, an example is illustrated in FIG. 3 as the first to third decoding parameters 111 to 113 are stored in the memory 110. However, the number of decoding parameters stored in the memory 110 is not limited to the example of FIG. 3.

The initial LLR values 115 may include initial log-likelihood ratios (LLRs) associated with, e.g. assigned to, respective bits of data "DATA". In response to a request of the LDPC decoder 120 or under control of the adaptive decoding controller 130, the memory 110 may transfer the initial LLR values 115 to the LDPC decoder 120 when the LDPC decoder 120 initiates the LDPC decoding.

The LDPC decoder 120 includes a storage block 121 and a computation block 125, both of which may be or correspond to circuits/circuitry. The storage block 121 may include a data buffer 122, a variable node buffer 123, and a check node buffer 124. The data buffer 122 may store the data "DATA" received from the first external device (e.g., the memory device 1300 of FIG. 12). For example, the data buffer 122 may receive the data "DATA" from a NAND flash memory device. The variable node buffer 123 may store variable nodes, e.g. addresses of variable nodes, of the LDPC decoding and values of the variable nodes. The check node buffer 124 may store check nodes, e.g. addresses of check nodes, of the LDPC decoding and values of the check nodes. The computation block 125 includes an initial mapper 126, a check node updater 127, and a variable node updater 128. The initial mapper 126, the check node updater 127, and the variable node updater 128 may be or correspond to circuits/circuitry and/or software executing on hardware.

The initial mapper 126 may receive the data "DATA" from the data buffer 122 and may receive the initial LLR values 115 from the memory 110. The initial mapper 126 may map the data "DATA" to the initial LLR values 115 and may store a result of the mapping in the variable node buffer 123. For example, the initial mapper 126 may map one initial LLR value of the initial LLR values 115 to each bit of the data "DATA", based on each of bits of the data "DATA".

The check node updater 127 may update values of check nodes by using values of variable nodes stored in the variable node buffer 123. The check node updater 127 may store the updated values of the check nodes in the check node buffer 124. A path/connection that starts from the variable node buffer 123 and/or a variable node in the variable node buffer 123 and is connect to the check node buffer 124 or a check node through the check node updater 127 may be or correspond to an "edge", e.g. a directed edge of a graph between variable nodes and check nodes. An edge value may "move" through the edge. The edge value may include values of variable nodes stored in the variable node buffer 123. In the case of the edge transmitting a message of two or more bits, the edge value may include an edge sign value and an edge magnitude value.

In some example embodiments, the edge value of 2 bits corresponding to a number "1" may be expressed by "10". In this case, an edge sign value may be a first value, e.g. a "1". The edge sign value may indicate that a sign of a number "1" is a positive sign. The edge magnitude value may be "0". The edge magnitude value may indicate that the magnitude of a number "1" is smaller than/less than another number (e.g., a number "2").

The variable node updater 128 may update values of variable nodes by using the values of the check nodes stored in the check node buffer 124, the decoding parameter received from the memory 110, and the data "DATA" (referred to as "channel data") transferred from the data buffer 122. The variable node updater 128 may store the updated values of the variable nodes in the variable node buffer 123. A path/connection that starts from the check node buffer 124 or a check node in the check node buffer 124 and is connect to the variable node buffer 123 and/or a variable node through the variable node updater 128 may be an "edge". An edge value may "move" through the edge. The edge value may include values of check nodes stored in the check node buffer 124.

The adaptive decoding controller 130 includes a quantizer 131, a syndrome calculator 132, an error rate calculator 133, and a decoding parameter controller 134. The quantizer 131 may convert the values of the check nodes stored in the variable node buffer 123 to digital values. For example, the quantizer 131 may convert a value of one variable node to one digital bit. Each of the quantizer 131, the syndrome calculator 132, the error rate calculator 133, and the decoding parameter controller 134 may be or correspond to hardware and/or software executable on hardware.

The syndrome calculator 132 may receive digital bits from the quantizer 131. The digital bits received from the quantizer 131 may be or correspond to an intermediate result of the data "DATA", to which the LDPC decoding performed up to now is applied. The syndrome calculator 132 may calculate syndromes (or syndromes including a syndrome vector) by multiplying the digital bits and a parity check matrix (or an H matrix) (e.g., a parity check matrix H0 of FIG. 5 or a parity check matrix H1 of FIG. 8) together (e.g., by performing an appropriate matrix product).

For example, when values of the variable nodes associated with the digital bits are correct values, a result of the syndrome calculation may be "0". When values of the variable nodes associated with the digital bits are incorrect values, the result of the syndrome calculation may be "1". The number of 1's calculated through the syndrome calculation may be the number of incorrect values (e.g., errors) present in the digital bits (or the values of the variable nodes).

The syndrome calculator 132 may transfer the number of 1's calculated through the syndrome calculation, for example, the number of errors present in the intermediate result of the LDPC decoding to the error rate calculator 133. The error rate calculator 133 may calculate an error rate depending on the number of errors. For example, the error rate calculator 133 may calculate a ratio of the number of errors to the number of variable nodes (e.g., the number of bits, symbols, or samples of the data "DATA") as the error rate.

For another example, the error rate calculator 133 may calculate a ratio/fraction of the number of errors to the number of check nodes (e.g., the number of correctable bits, symbols, or samples) as the error rate. For another example, the error rate calculator 133 may calculate the error rate by normalizing the number of errors by using a specific constant and/or variable.

In some example embodiments, when a value of a specific check node is "0", values of variable nodes associated with the specific check node, e.g. variable nodes having an edge connecting the variable node to the specific check node, may not have an error. In some example embodiments, when the value of the specific check node is "1", the values of the variable nodes associated with the specific check node, e.g. having an edge connecting the variable node to the specific check node, may have an error. For example, the number of errors detected by the syndrome calculator 132 may be interpreted as the number of check nodes having a first value, e.g. a value of "1".

In some example embodiments, the error rate may be calculated as a number corresponding to a ratio and/or a fraction of the number of check nodes having a value of "1" to the number of variable nodes. For another example, the error rate may be calculated as a number corresponding to a ratio and/or a fraction of the number of check nodes having a value of "1" to the number of check nodes. For another example, the error rate may be calculated by normalizing the number of check nodes having a value of "1" by using a specific constant and/or variable.

The error rate calculator 133 may transfer the calculated error rate to the decoding parameter controller 134. The decoding parameter controller 134 may control the memory 110 depending on the error rate. For example, the decoding parameter controller 134 may allow the memory 110 to output a decoding parameter varying depending on the error rate.

Figure 4:
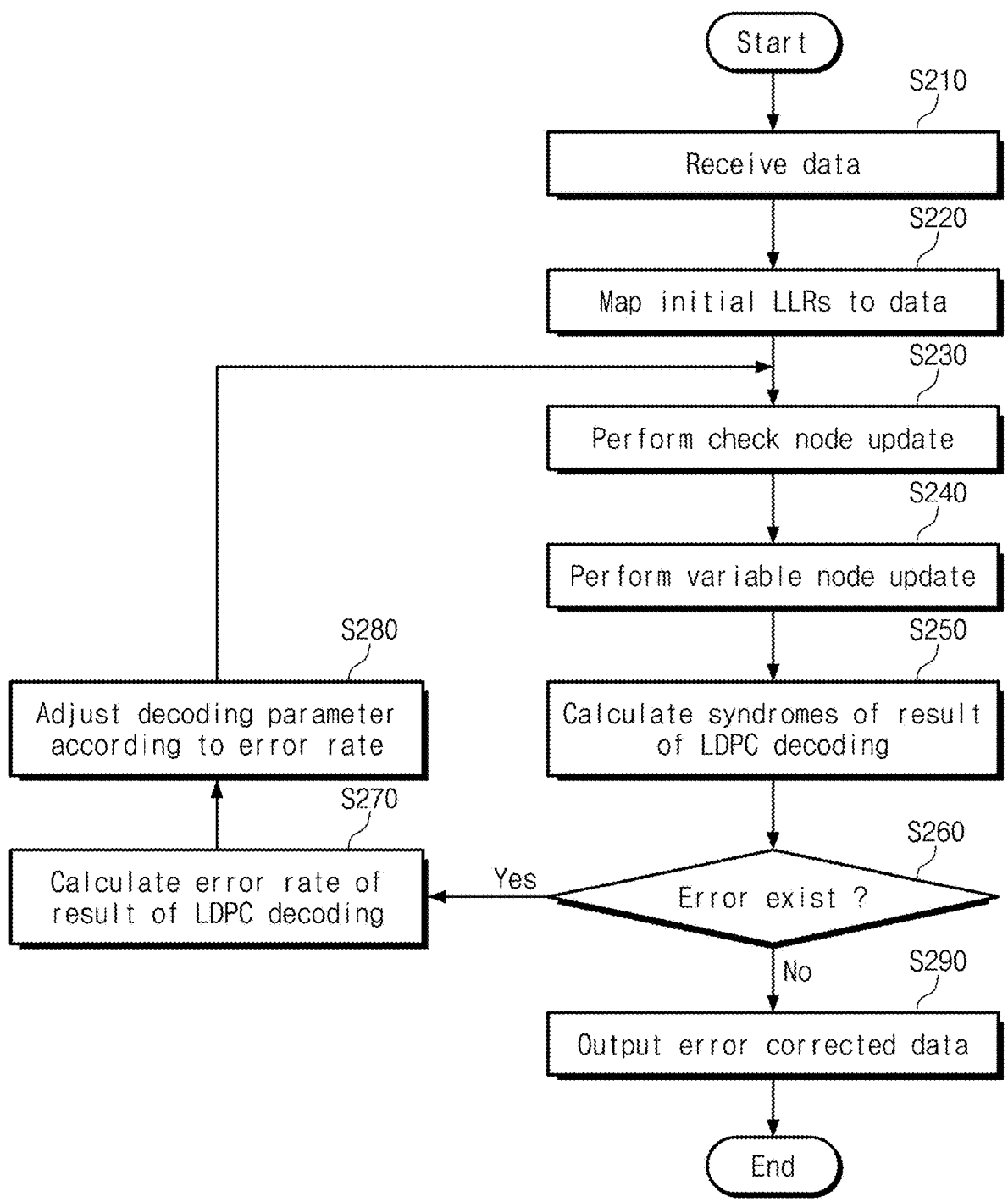
FIG. 4 is a flowchart illustrating an operating method of an error correction circuit of FIG. 3.
Figure 5:
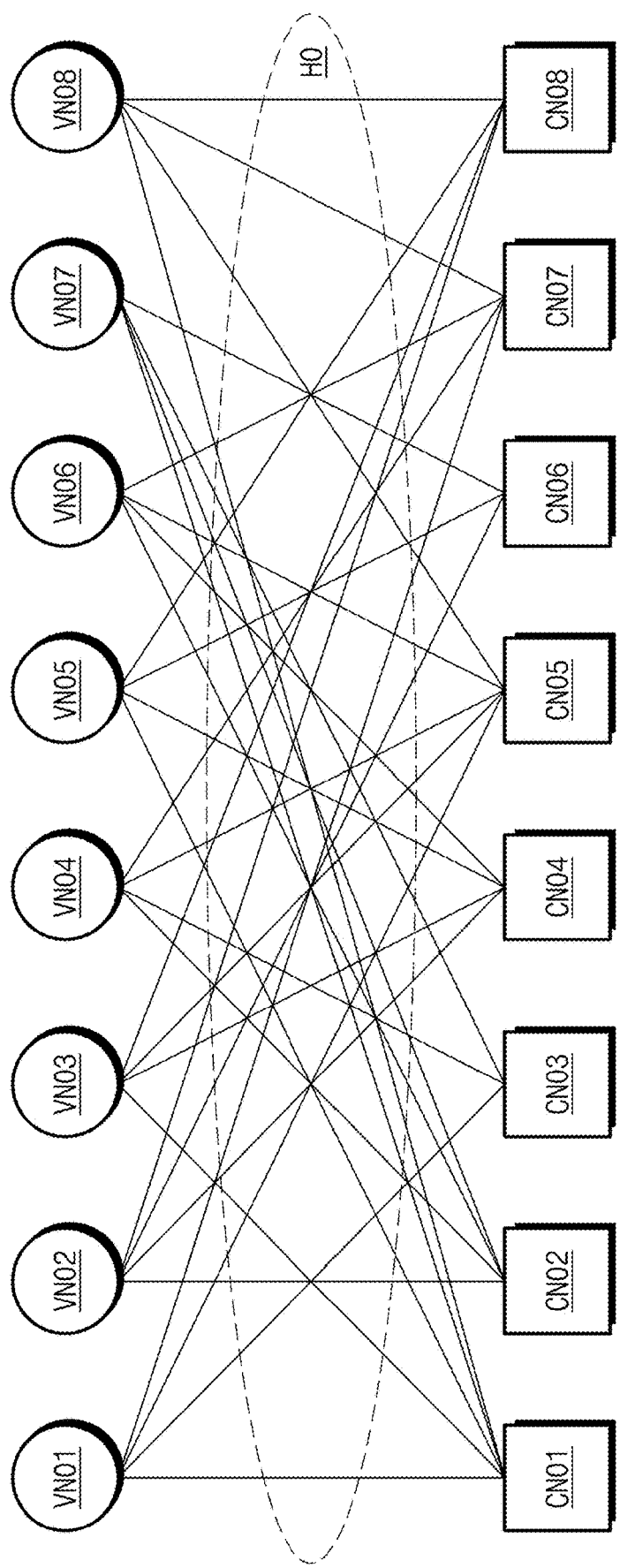
FIG. 5 illustrates an example of variable nodes and check nodes calculated at an LDPC decoder, according to some example embodiments of inventive concepts.

FIG. 4 is a flowchart illustrating an operating method of the error correction circuit 100 of FIG. 3. FIG. 5 illustrates an example of a bipartite graph relating variable nodes VN01-VN08 to check nodes CN01-CN08 calculated at the LDPC decoder 120, according to some example embodiments of inventive concepts. The variable node buffer 123 of FIG. 3 may include the variable nodes VN01 to VN08 of FIG. 5, and the check node buffer 124 of FIG. 3 may include the check nodes CN01 to CN08 of FIG. 5.

Referring to FIGS. 3 to 5, in operation S210, the LDPC decoder 120 may receive the data "DATA". The data "DATA" may be stored in the data buffer 122. In operation S220, the initial mapper 126 of the LDPC decoder 120 may map initial LLR values to the data "DATA".

For example, the initial mapper 126 may receive the initial LLR values from the memory 110 and may map one of the initial LLR values to each bit, sample, and/or symbol of the data "DATA" depending on a value of each bit, sample, and/or symbol of the data "DATA". The result of mapping the initial LLR values may be stored in the variable node buffer 123. For example, the result of mapping the initial LLR values may be stored as initial values of the variable nodes VN01 to VN08.

In operation S230, the check node updater 127 of the LDPC decoder 120 may update values of the check nodes CN01 to CN08. For example, the check node updater 127 may update the values of the check nodes CN01 to CN08 by using the Min method of the Min-Sum method. The check node updater 127 may update the values of the check nodes CN01 to CN08 by using Equation 1 below.

$$p_{m,n} = \min_{n \in M(m) \backslash n} |q_{n,m}| \cdot \prod_{n' \in M(m) \backslash n} \text{sign}(q_{n,m})$$

In Equation 1 above, "$p_{m,n}$" indicates a message that indicates that a value of an m-th check node ("m" being a positive integer) is updated and that the m-th check node transfers to an n-th variable node ("n" being a positive integer). M(m) indicates variable nodes connected with the m-th check node. For example, when "m" is 2, variable nodes M(2) connected with the second check node CN02 may include second, fourth, sixth, and seventh variable nodes VN02, VN04, VN06, and VN07. The graph-degree of the second check node CN02 may be "4", corresponding to the number of variable nodes connected with the second check node CN02.

In Equation 1 above, "$q_{n',m}$" may be a message that an n'-th variable node transfers to the m-th check node in current LDPC decoding. The n'-th variable node may belong to M(m), thus being a variable node connected with the m-th check node. For example, in the case where the LDPC decoding is performed for the first time, "$q_{n',m}$" may be initial values of the variable nodes VN01 to VN08. In the case where the LDPC decoding is performed more than once, "$q_{n',m}$" may be values of the variable nodes VN01 to VN08 calculated in previous LDPC decoding. In Equation 1 above, "sign($q_{n',m}$)" may indicate a sign (positive or negative) of the n-th variable node.

According to Equation 1 above, the m-th check node may have a low/minimum value of values of the remaining variable nodes (e.g., effective variable nodes) other than the n-th variable node, to which the m-th check node intends to transfer a message, from among the variable nodes M(m) connected with the m-th check node. Also, the m-th check node may have a sign that is decided depending on a result of multiplying all signs of effective variable nodes together.

For example, when "m" is 2 and "n" is 4, the second, sixth, and seventh variable nodes VN02, VN06, and VN07 may be effective variable nodes. In operation S240, the variable node updater 128 of the LDPC decoder 120 may update values of the variable nodes VN01 to VN08. For example, the variable node updater 128 may update the values of the variable nodes VN01 to VN08 by using the Sum method of the Min-Sum method.

The variable node updater 128 may use the decoding parameter received from the memory 110 when updating values of the variable nodes VN01 to VN08. For example, the variable node updater 128 may update the values of the variable nodes VN01 to VN08 by using Equation 2 below.

$$q_{n,m} = \phi_{vc}\left(\sum_{m' \in N(n) \backslash m} \phi_{cv}(p_{m',n}) + \phi_{ch}(C_n)\right)$$

In equation 2, "$q_{n,m}$" indicates/corresponds to a message that indicates that a value of the n-th variable node is updated and that the n-th variable node transfers to the m-th check node. N(n) indicates check nodes connected with the n-th variable node. Referring to FIG. 5, when "n" is 3, check nodes N(3) connected with the third variable node VN03 may include first, fourth, fifth, and eighth check nodes CN01, CN04, CN05, and CN08. The graph-degree of the third variable node VN03 may be "4" being the number of check nodes connected with the third variable node VN03. In some example embodiments, the number of check nodes connected with each of the variable nodes VN01 to VN08 of FIG. 5 is "4". As such, in the case where the number of check nodes connected with each of the variable nodes VN01 to VN08 is identical, that is, graph-degrees of variable nodes are identical, the parity check matrix H0 may be referred to as a "regular parity check matrix". Herein, a "regular" bipartite graph may mean a graph wherein each node on one of the partitions has a same number of edges connecting to the other partition. As illustrated in FIG. 5, one partition of the bipartite graph may correspond to variable nodes, and another partition of the bipartite graph may correspond to check node. A degree, e.g. an graph-degree, of each of the variable nodes VN01 to VN08 is "4", and the bipartite graph of FIG. 5 may be described as a regular bipartite graph. The parity check matrix H0 will be more fully described with reference to FIG. 6. Further, although FIG. 5 illustrates that a number of variable nodes VN01 to VN08 is the same as a number of check nodes CN01 to CN08, example embodiments are not limited thereto, and the number of variable nodes may be greater than the number of check nodes.

In Equation 2 above, "$p_{m',n}$" may be or correspond to a message that an m'-th check node transfers to the n-th variable node in current LDPC decoding. The m'-th check node may belong to N(n), thus being a check node connected with the n-th variable node. For example, "$p_{m',n}$" may be values of the check nodes CN01 to CN08 calculated in current LDPC decoding.

In Equation 2 above, "$\varphi\tilde{O}_{cv}$" may be a function having a value that is decided according to a message that the m'-th check node transfer to the n-th variable node. A value of "$\varphi\tilde{O}_{cv}$" may depend on the decoding parameter transferred from the memory 110 and may be defined as illustrated in Table 1 below. In Table 1 below, for brief expression, the input "$p_{m',n}$" is replaced with "x", and the output "$\varphi\tilde{O}_{cv}$" is replaced with "y".

TABLE 1

| Input x | 00 | 01 | 10 | 11 |
|---------|----|----|----|----|
| Output y | T1 | T2 | −T1 | −T2 |

In Table 1 above, LLR values T1 and T2 may be or correspond to values transferred from the memory 110 and may vary depending on an error rate. In some example embodiments, the value of "$\varphi\tilde{O}_{cv}$" is described under assumption that the LDPC decoder 120 is a 2-bit decoder. However, the LDPC decoder 120 is not limited to the 2-bit decoder.

When the LDPC decoder 120 is a k-bit decoder ("k" being a positive integer), the input "x" may be k-bit information. Also, the output "y" may be expressed by "k" values and positive and negative signs. In some example embodiments, "$\varphi\tilde{O}_{cv}$" may assign an LLR value (e.g., a log likelihood ratio) to a message transferred from the m'-th check node.

In Equation 2 above, "$\varphi\tilde{O}_{cv}$" may be or correspond to a function having a value that is decided by a bit Cn, sample, or symbol, which is associated with the n-th variable node, of the data "DATA". A value of "$\varphi\tilde{O}_{cv}$" may depend on the decoding parameter transferred from the memory 110.

When the LDPC decoder 120 is a k-bit decoder, the input "x" may be divided into $2^k$ periods. Also, the output "y" may be expressed by "k" bits. In some example embodiments, "$\varphi\tilde{O}_{cv}$" may be an intermediate result calculated by current LDPC decoding. A value of "$\varphi\tilde{O}_{cv}$" may indicate how much a value of each variable node is close to "1" or is close to "0". A value of "$\varphi\tilde{O}_{cv}$" may depend on the decoding parameter transferred from the memory 110.

According to Equation 2 above, a value or message of the n-th variable node may be decided depending on values of the remaining check nodes (e.g., effective check nodes) other than the m-th check node, to which the n-th variable node intends to transfer, from among the check nodes N(n) connected with the n-th variable node.

For example, when "n" is 3 and "m" is 2, the third check node CN03 may be or correspond to an effective check node. For example, the value or message of the n-th variable node may be decided by a sum of values of effective check nodes and a sum of values to which the bit Cn, sample, and/or symbol of the data "DATA" associated with the n-th variable node is applied.

In operation S250, the adaptive decoding controller 130 may calculate syndromes of the result of the LDPC decoding. For example, the quantizer 131 may quantize values of the variable nodes stored in the variable node buffer 123. For example, when a value of a specific variable node is smaller/less than "0", the quantizer 131 may quantize the value associated with the specific variable node to "0". When the value associated with the specific variable node is "0" or more, the quantizer 131 may quantize the value of the specific variable node to "1".

For example, when a digital value of a specific variable node is "11" or "10", the quantizer 131 may quantize the value of the specific variable node to "0". When the digital value of the specific variable node is "00" or "01", the quantizer 131 may quantize the value of the specific variable node to "1".

In some example embodiments, when the data "DATA" are composed of symbols and/or samples including two or more bits, the quantizer 131 may quantize a value of a variable node to symbols or samples including two or more bits. The number of bits of each variable node quantized by the quantizer 131 is not limited to the above examples.

Bits, samples, and/or symbols quantized by the quantizer 131 may be a result of performing the LDPC decoding, for example, a result of performing the LDPC decoding once. The result of the LDPC decoding may be transferred to the syndrome calculator 132, for example, as an intermediate decoding result of the whole error correction operation of the error correction circuit 100.

The syndrome calculator 132 may calculate syndromes as the result of the LDPC decoding. For example, the syndrome calculator 132 may compute (e.g., multiply and/or matrix multiply) the LDPC decoding result and the parity check matrix (e.g., the parity check matrix of FIG. 6 or 8). A result of the computation may indicate a set of bits each having one of "0" and "1".

For example, the number of bits of the computation result may be the number of all syndromes. The number of bits of the computation result may be or be associated with the maximum number of error bits that the error correction circuit 100 is capable of correcting. A bit, which has a value of "1", from among the bits of the computation result indicates that an error exists. The number of bits, which have a value of "1", from among the bits of the computation result indicates the number of bits present in the LDPC decoding result.

In operation S260, the adaptive decoding controller 130 may determine whether an error is present in the LDPC decoding result. In some example embodiments, when the bits of the computation result do not have a value of "1", the LDPC decoding result may not have an error. When at least one of the bits of the computation result has a value of "0", the LDPC decoding result may have at least one error.

When an error does not exist, in operation S290, the adaptive decoding controller 130 may output the LDPC decoding result quantized by the quantizer 131 to the second external device (e.g., the host 1200 of FIG. 12) as the error-corrected data DATA_C. The adaptive decoding controller 130 may terminate error correction associated with the received data "DATA".

When an error exists, in operation S270, the error rate calculator 133 of the adaptive decoding controller 130 may calculate an error rate of the LDPC decoding result. For example, the syndrome calculator 132 may transfer the bits of the computation result to the error rate calculator 133. The error rate calculator 133 may count the number of bits, each of which has a value of "1", from among the bits of the computation result, that is, the number of errors. The error rate calculator 133 may calculate an error rate by using the number of errors thus counted.

For example, the error rate calculator 133 may calculate a ratio of or a fraction of the number of error bits to the total number of bits of the computation result (e.g., the total number of check nodes) as the error rate. For another example, the error rate calculator 133 may calculate a ratio of the number of error bits to the number of bits, samples, or symbols of the data "DATA" (e.g., the total number of variable nodes) as the error rate.

For another example, the error rate calculator 133 may calculate the error rate by normalizing the number of errors to a specific constant, variable, and/or function. The error rate calculator 133 may be changed or applied to calculate an error rate by using various methods. The form of the error rate that the error rate calculator 133 calculates is not limited to the above description.

In operation S280, the decoding parameter controller 134 of the adaptive decoding controller 130 may adjust a decoding parameter depending on the error rate. For example, the error rate calculator 133 may transfer the calculated error rate to the decoding parameter controller 134. The adaptive decoding controller 130 may allow the memory 110 to output a decoding parameter varying depending on the error rate.

Afterwards, a check node may be updated in operation S230, and a variable node may be updated in operation S240. For example, the check node update and the variable node update may constitute or correspond to one LDPC decoding/one iteration of LDPC decoding. One LDPC decoding may accompany the calculating of the syndromes (S250), the calculating of the error rate (S270), and the adjusting of the decoding parameter (S280).

The error correction circuit 100 may repeatedly perform the LDPC decoding until an error is absent from the LDPC decoding result. When the LDPC decoding is repeated, the error correction circuit 100 may adjust a decoding parameter depending on a result of the LDPC decoding. Because the decoding parameter is adaptively adjusted depending on an error rate, the error floor of the error correction circuit 100 may decrease.

Figure 6:
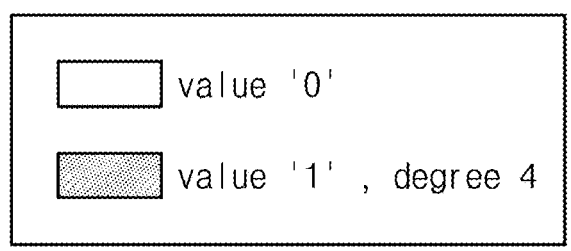
FIG. 6 illustrates a parity check matrix FIG. 5.

FIG. 6 illustrates the parity check matrix H0 of FIG. 5. Referring to FIG. 6, the parity check matrix H0 is illustrated in the form of a numerical value. The parity check matrix H0 may include rows RL01 to RL08 and columns CL01 to CL08. The parity check matrix may correspond to a matrix relating linear relations between the variable nodes and the check nodes. Although FIG. 6 illustrates that the number of columns CL01 to CL08 is equal to the number of rows RL01 to RL08, example embodiments are not limited thereto, and the number of columns may be greater than the number of rows.

Referring to FIGS. 5 and 6, each of elements included in the parity check matrix H0 may have a first value, e.g. a "1" indicating a connection between a variable node and a check node existing and may have a second value, e.g. a "0" indicating a connection between a variable node and a check node not existing. For example, the element at the second row RL02 and the second column CL02 of the parity check matrix H0 may have value "1", and the second check node CN02 may be connected with the second variable node VN02. The element at the second row RL02 and the third column CL03 of the parity check matrix H0 may have value "0", and the second check node CN02 may not be connected with the third variable node VN03. In some example embodiments, the LDPC decoder 120 may check an error of a bit and an error rate based on a product of the parity check matrix H0 and a column vector including bit information of the variable nodes VN01 to VN08.

In FIG. 6, each of the columns CL01 to CL08 may include four elements each having value "1". For example, each of the variable nodes VN01 to VN08 may be connected with four (different) check nodes. Accordingly, the graph-degree of each of the variable nodes VN01 to VN08 may be "4", and the parity check matrix H0 may be referred to as a "regular parity check matrix".

In the parity check matrix H0 illustrated in FIG. 6, the number of rows and the number of columns are examples only, and inventive concepts are not limited to the example of FIG. 6. In another embodiment, the parity check matrix H0 may include 8 to 12 rows corresponding to 8 to 12 check nodes and 140 to 150 columns corresponding to 140 to 150 variable nodes. In some example embodiments, the rows RL01 to RL08 of the parity check matrix H0 may be divided into a plurality of rows, and the columns CL01 to CL08 of the parity check matrix H0 may be divided into a plurality of columns. For example, the rows RL01 to RL08 of the parity check matrix H0 may be divided into 256 rows corresponding to 256 check nodes, and the columns CL01 to CL08 of the parity check matrix H0 may be divided into 256 columns corresponding to 256 variable nodes. In this case the parity check matrix H0 may include 65,536 (=256×256) elements.

Figure 7:
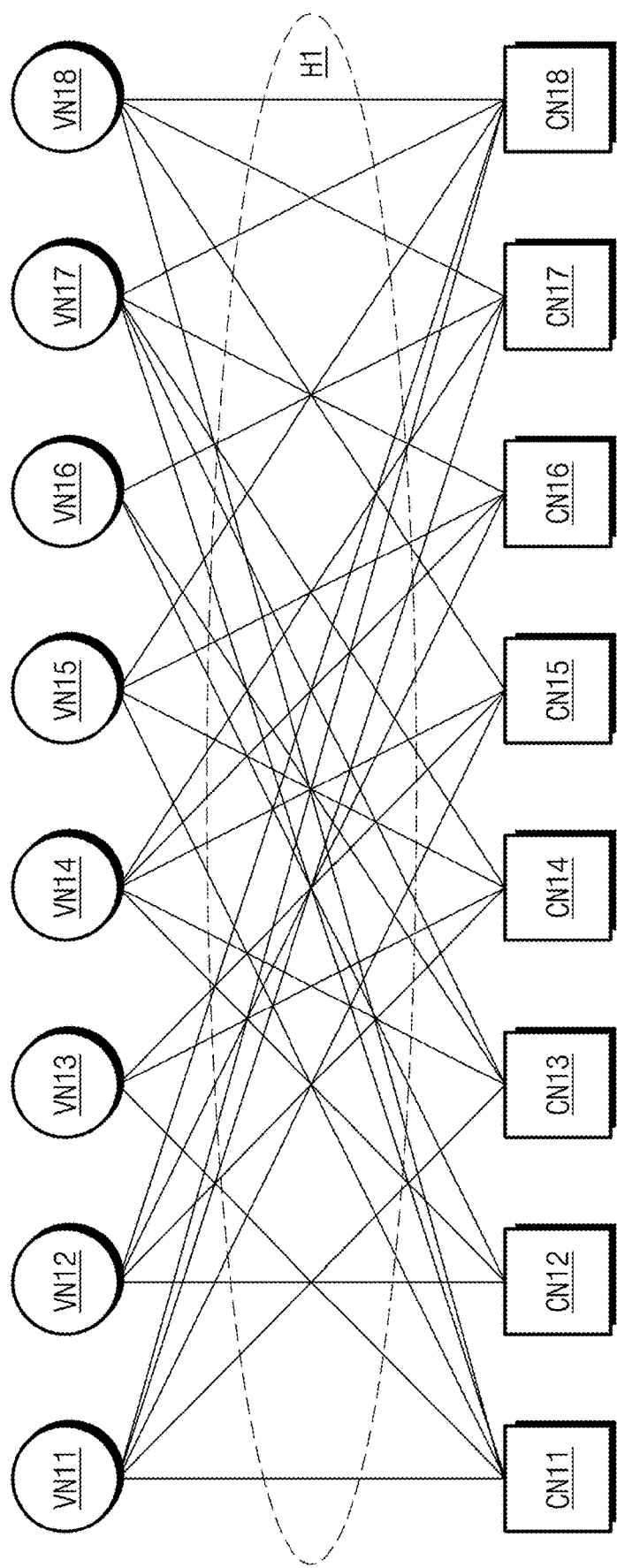
FIG. 7 illustrates an example of variable nodes and check nodes calculated at an LDPC decoder, according to another embodiment of inventive concepts.

FIG. 7 illustrates an example of variable nodes VN11 to VN18 and check nodes CN11 to CN18 calculated at the LDPC decoder 120, according to another embodiment of inventive concepts. The principle of decoding performed on the variable nodes VN11 to VN18 and the check nodes CN11 to CN18 of FIG. 7 may be substantially identical to the principle of decoding performed on the variable nodes VN01 to VN08 and the check nodes CN01 to CN08 of FIG. 5. However, the connection relationship between the variable nodes VN11 to VN18 and the check nodes CN11 to CN18 of FIG. 7, that is, edges may be different from the edges of FIG. 5. For convenience of description, to distinguish FIG. 7 from FIG. 5, the variable nodes VN11 to VN18 may be respectively referred to as "first to eighth variable nodes", and the check nodes CN11 to CN18 may be respectively referred to as "first to eighth check nodes".

In FIG. 7, the number of check nodes connected with each of the variable nodes VN11 to VN18 may be variable, e.g. the graph-degree of each of the variable nodes VN11 to VN18 may be variable. The number of check nodes CN11, CN13, CN15, CN17, and CN18 connected with the first variable node VN11, the number of check nodes CN12, CN13, CN15, CN16, and CN17 connected with the fourth variable node VN14, and the number of check nodes CN11, CN13, CN14, CN16, and CN18 connected with the seventh variable node VN17 may be "5". That is, the degree of each of the first, fourth, and seventh variable nodes VN11, VN14, and VN17 may be "5".

The number of check nodes CN12, CN14, CN16, and CN18 connected with the second variable node VN12, the number of check nodes CN11, CN14, CN16, and CN18 connected with the fifth variable node VN15, and the number of check nodes CN11, CN15, CN17, and CN18 connected with the eighth variable node VN18 may be "4". That is, the degree of each of the second, fifth, and eighth variable nodes VN12, VN15, and VN18 may be "4", and may not be the same as the graph-degree of variable nodes VN11, VN14, and VN17.

The number of check nodes CN11, CN14, and CN15 connected with the third variable node VN13 and the number of check nodes CN12, CN13, and CN17 connected with the sixth variable node VN16 may be "3". For example, the degree of each of the third and sixth variable nodes VN13 and VN16 may be "3".

As such, in the case where the number of check nodes connected with each of the variable nodes VN11 to VN18, that is, the degree of each of the variable nodes VN11 to VN18 is not identical, the bipartite graph of FIG. 7 may be an "irregular" bipartite graph, and a parity check matrix H1 may be referred to as an "irregular parity check matrix". The parity check matrix H1 may mean a mathematical relationship between the variable nodes VN11 to VN18 and the check nodes CN11 to CN18. The parity check matrix H1 will be more fully described with reference to FIG. 8.

Figure 8:
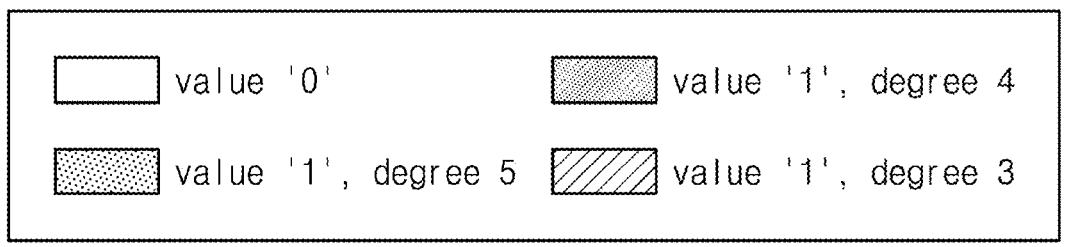
FIG. 8 illustrates a parity check matrix FIG. 7.

FIG. 8 illustrates the parity check matrix H1 of FIG. 7. The parity check matrix H1 of FIG. 8 is illustrated in the form of a numerical value like the parity check matrix H0 of FIG. 6. The parity check matrix H1 may include the rows RL11 to RL18 and the columns CL11 to CL18. Because the principle for the parity check matrix H1 is substantially identical to the principle for the parity check matrix H0 of FIG. 6, a difference between the parity check matrices H0 and H1 will be mainly described below.

In FIG. 8, each of the first, fourth, and seventh columns CL11, CL14, and CL17 may include 5 elements each having a first value, e.g. a value of "1", and each of the variable nodes VN11, VN14, and VN17 may be connected with 5 check nodes. Each of the second, fifth, and eighth columns CL12, CL15, and CL18 may include 4 elements each having the first value "1", and each of the variable nodes VN12, VN15, and VN18 may be connected with 4 check nodes. Each of the third and sixth columns CL13 and CL16 may include 3 elements each having the first value "1", and each of the variable nodes VN13 and VN16 may be connected with 3 check nodes. Accordingly, the degrees of all the variable nodes VN01 to VN08 may not be identical, and the parity check matrix H1 may be referred to as an "irregular parity check matrix".

In FIG. 8, the maximum degree of the variable nodes VN01 to VN08 is "5", and the minimum degree of the variable nodes VN01 to VN08 is "3". However, inventive concepts are not limited to the above examples, and it may be obvious to one of ordinary skill in the art that variable nodes have more various degrees.

Figure 9:
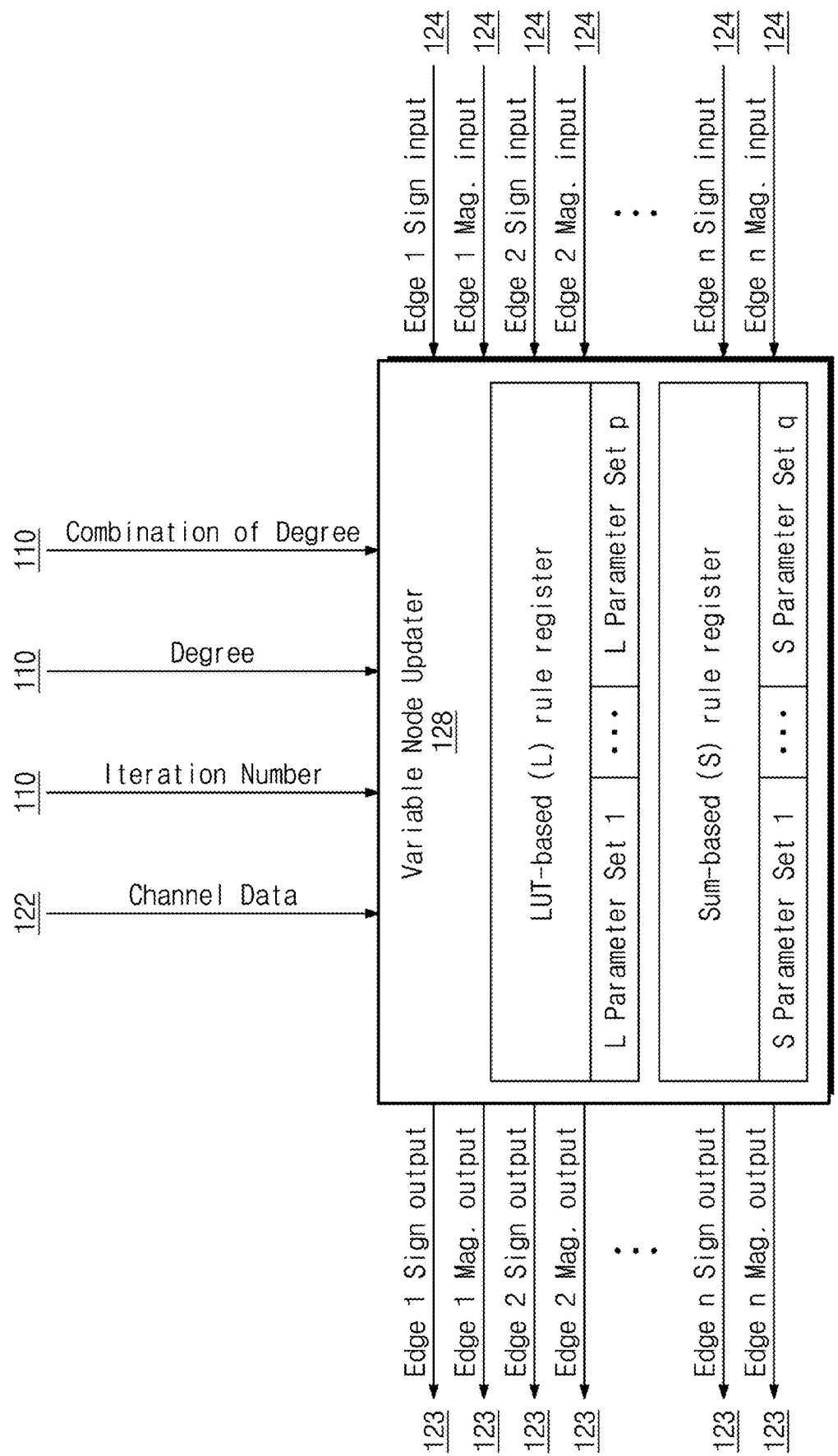
FIG. 9 illustrates a variable node updater of FIG. 3 in detail.

FIG. 9 illustrates a variable node updater of FIG. 3 in detail. FIG. 9 will be described with reference to FIGS. 3, 7, and 8. It is assumed that the variable node updater 128 of FIG. 9 includes the variable nodes VN11 to VN18 and the check nodes CN11 to CN18 of FIG. 7 and the memory 110 includes the parity check matrix H1 of FIG. 8.

The variable node updater 128 may receive at least one decoding parameter (e.g., the first, second, or third decoding parameter of FIG. 1) including the number of iterations, degrees of the variable nodes VN11 to VN18, and information about a combination of degrees from the memory 110 of FIG. 3. The number of iterations may refer to the number of iterations of decoding performed by the LDPC decoder 120. For example, the variable node updater 128 may receive information about the degrees of the respective variable nodes VN11 to VN18 from the memory 110 of FIG. 3, based on the connection relationship of FIG. 7 and the parity check matrix H1 of FIG. 8. For example, the variable node updater 128 may receive information about a combination {5, 4, 3} of the degrees of the variable nodes VN11 to VN18 from the memory 110 of FIG. 3, based on the connection relationship of FIG. 7 and the parity check matrix H1 of FIG. 8. The variable node updater 128 may receive channel data (DATA of FIG. 3) from the data buffer 122.

In FIG. 9, it is assumed that the number of edges between the check nodes CN11 to CN18 included in the check node buffer 124 of FIG. 3 and the variable nodes VN11 to VN18 included in the variable node buffer 123 of FIG. 3 is "n" (n being a natural number). An edge value of each of the edges may include an edge sign value and an edge magnitude value. In FIG. 9, edge values that are input from the check node buffer 124 to the variable node updater 128 may include an edge sign value input and an edge magnitude value input, and edge values that are output from the variable node updater 128 to the variable node buffer 123 may include an edge sign value output and an edge magnitude value output. For example, the variable node updater 128 may generate the edge sign value output and the edge magnitude value output by updating the edge sign value and the edge magnitude value based on a parameter stored in at least one of an LUT-based (L) rule register and a sum-based (S) rule register to be described later.

The variable node updater 128 may include the LUT-based (L) rule register and the sum-based (S) rule register that store information about a decoding rule corresponding to degrees of variable nodes included in the decoding parameter. In detail, the LUT-based (L) rule register may store and include at least one or more LUT parameter sets L Parameter Set 1 to L Parameter Set p (p being a natural number) respectively corresponding to at least one or more LUT-based rules, and the sum-based (S) rule register may store and include at least one or more sum parameter sets S Parameter Set 1 to S Parameter Set q (q being a natural number) respectively corresponding to at least one or more sum-based rules.

In some example embodiments, in the case where "p" is 2, the LUT-based (L) rule register may store first and second LUT parameter sets L Parameter Set 1 and L Parameter Set 2. The first LUT parameter set L Parameter Set 1 may correspond to the first LUT-based rule, and the second LUT parameter set L Parameter Set 2 may correspond to the second LUT-based rule. For example, in the case where the variable node updater 128 decides the first LUT-based rule for the purpose of updating the first edge sign value input Edge 1 Sign input based on at least one of the channel data, the number of iterations, a degree, or the combination of degrees, the variable node updater 128 may update the first edge sign value input Edge 1 Sign input based on the first LUT parameter set L Parameter Set 1 and may generate the first edge sign value output Edge 1 Sign output based on the updated first edge sign value input. In the case where the variable node updater 128 decides the second LUT-based rule for the purpose of updating the first edge sign value input Edge 1 Sign input and updates the first edge sign value input Edge 1 Sign input based on the second LUT parameter set L Parameter Set 2, the first edge sign value output Edge 1 Sign output generated by the variable node updater 128 may be different from the first edge sign value output Edge 1 Sign output generated based on the first LUT-based rule. The principle described in the above example may be applied to inputs and outputs of sign values and magnitude values of the remaining edges Edge 2 to Edge n.

In some example embodiments, in the case where "q" is 2, the sum-based (S) rule register may store first and second sum parameter sets S Parameter Set 1 and S Parameter Set 2. The first sum parameter set S Parameter Set 1 may correspond to the first sum-based rule, and the second sum parameter set S Parameter Set 2 may correspond to the second sum-based rule. For example, in the case where the variable node updater 128 decides the first sum-based rule for the purpose of updating the second edge sign value input Edge 2 Sign input based on at least one of the channel data, the number of iterations, a degree, and the combination of degrees, the variable node updater 128 may update the second edge sign value input Edge 2 Sign input based on the first sum parameter set S Parameter Set 1 and may generate the second edge sign value output Edge 2 Sign output based on the updated second edge sign value input. In the case where the variable node updater 128 decides the second sum-based rule for the purpose of updating the second edge sign value input Edge 2 Sign input and updates the second edge sign value input Edge 2 Sign input based on the second sum parameter set S Parameter Set 2, the second edge sign value output Edge 2 Sign output generated by the variable node updater 128 may be different from the second edge sign value output Edge 2 Sign output generated based on the first sum-based rule. For example, in the case where the first sum-based rule refers to an operation of adding values stored at variable nodes and the second sum-based rule refers to an operation of calculating an exponential function value of a value obtained by adding the values stored at the variable nodes, the variable node updater 128 may add the second edge sign value input Edge 2 Sign input and the second edge magnitude value input Edge 2 Magnitude input based on the first sum parameter set S Parameter 1 and may calculate an exponential function value of a result obtained by adding the second edge sign value input Edge 2 Sign input and the second edge magnitude value input Edge 2 Magnitude input based on the second sum parameter set S Parameter Set 2. The principle described in the above example may be applied to inputs and outputs of sign values and magnitude values of the remaining edges Edge 1 and Edge 3 to Edge n.

Figure 10:
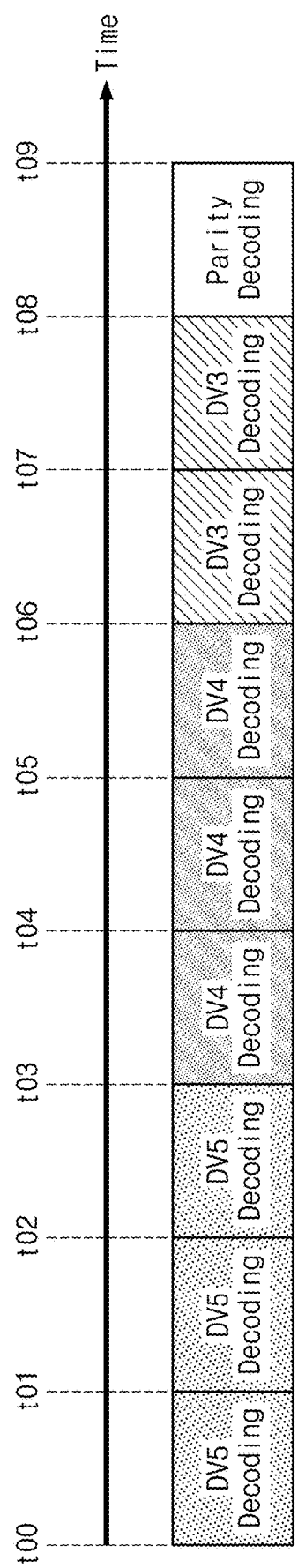
FIG. 10 is a timing diagram illustrating a decoding order according to some example embodiments of inventive concepts.

FIG. 10 is a timing diagram illustrating a decoding order according to some example embodiments of inventive concepts. FIG. 10 will be described together with the parity check matrix H1 with reference to FIGS. 3, 7, and 8, including the irregular parity check matrix. In FIG. 10, DV5 decoding, DV4 decoding, and DV3 decoding may indicate decoding for the variable nodes VN11, VN14, and VN17 each having degree "5", decoding for the variable nodes VN12, VN15, and VN18 each having degree "4", and decoding for the variable nodes VN13 and VN16 each having degree "3", respectively.

The LDPC decoder 120 may perform decoding from a time t00 to a time t09.

The LDPC decoder 120 may perform decoding for the variable nodes VN11, VN14, and VN17 each having degree "5" during a time period t00 to t03, may perform decoding for the variable nodes VN12, VN15, and VN18 each having degree "4" during a time period t03 to t06, and may perform decoding for the variable nodes VN13 and VN16 each having degree "3" during a time period t06 to t08. After the decoding for the variable nodes VN13 and VN16, during a time period t08 to t09, the LDPC decoder 120 may perform parity decoding based on a result of decoding the variable nodes VN10 to VN18. For example, the parity decoding may include at least one of quantization, syndrome computation, or decoding parameter control that are performed by the adaptive decoding controller 130 of FIG. 3.

For example, the LDPC decoder 120 may divide the time period t00 to t03 into a first sub-time period t00 to t01, a second sub-time period t01 to t02, and a third sub-time period t02 to t03. The LDPC decoder 120 may compare values of the variable nodes VN11, VN14, and VN17 each having degree "5". Based on a comparison result of the values of the variable nodes VN11, VN14, and VN17, the LDPC decoder 120 may perform decoding of the variable node VN11 during the first sub-time period t00 to t01, may perform decoding of the variable node VN14 during the second sub-time period t01 to t02, and may perform decoding of the variable node VN17 during the third sub-time period t02 to t03. However, the above decoding order is only an example, and inventive concepts are not limited to the above example.

Figure 11:
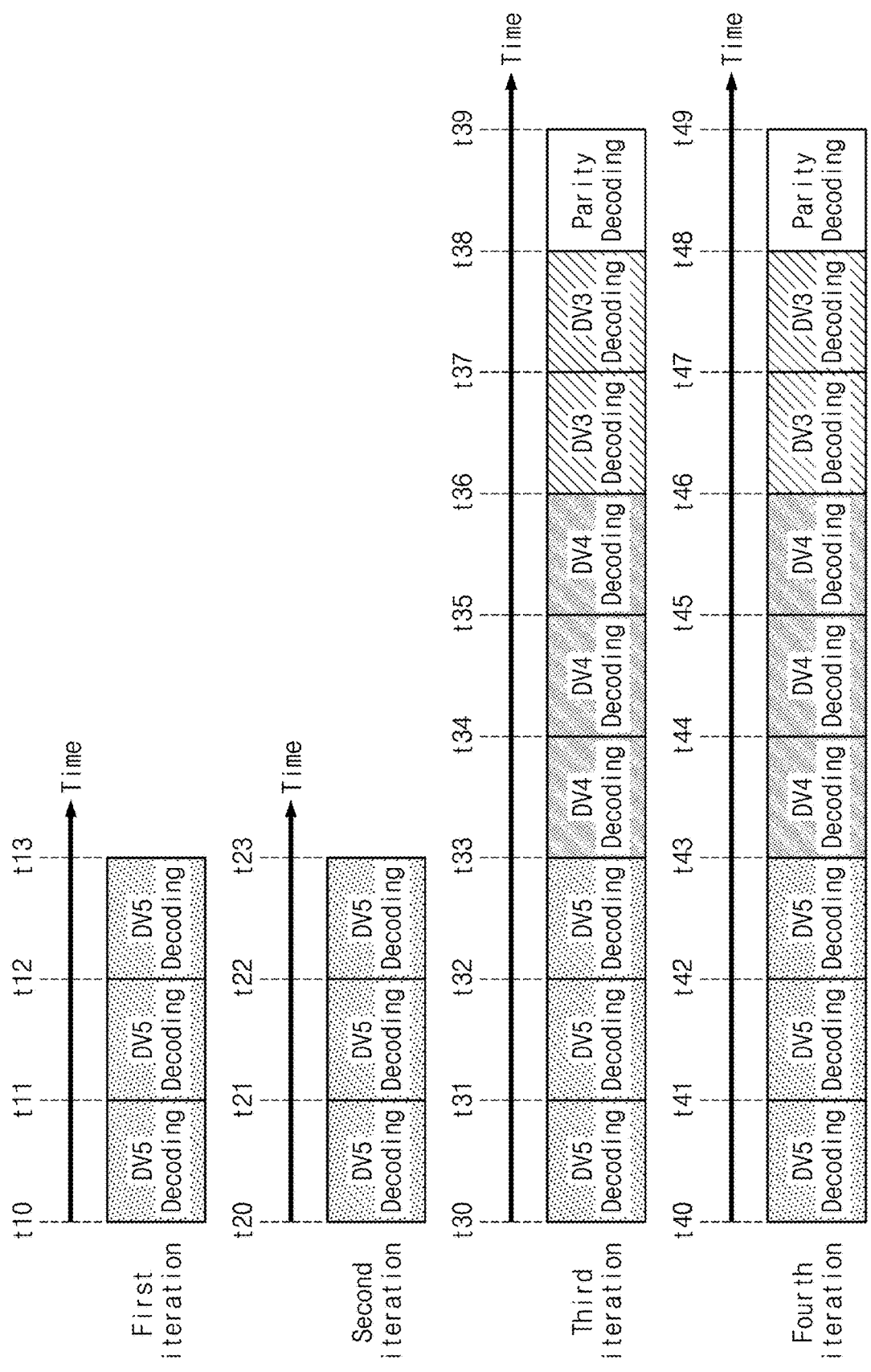
FIG. 11 is a timing diagram illustrating a decoding order in each iteration according to another embodiment of inventive concepts.

FIG. 11 is a timing diagram illustrating a decoding order in each iteration according to another embodiment of inventive concepts. First to fourth iterations are illustrated in FIG. 11, but the number of iterations in which decoding is performed by the error correction circuit 100 is not limited to the example illustrated in FIG. 11. FIG. 11 will be described together with the parity check matrix H1 with reference to FIGS. 3, 7, and 8.

In the first and second iterations, the LDPC decoder 120 may perform decoding only on variable nodes each having graph-degree "5" (DV5), e.g. may perform parallel decoding only on variable nodes each having graph-degree "5" (DV5). In a time period t10 to t13 corresponding to the first iteration and a time period t20 to t23 corresponding to the second iteration, the LDPC decoder 120 may sequentially perform decoding on the first, fourth, and seventh variable nodes VN11, VN14, and VN17 each having degree "5" (DV5) illustrated in FIGS. 7 and 8, independently of each other. In time periods t20 to t21, t21 to t22, and t22 to t23 included in the second iteration, the LDPC decoder 120 may perform decoding to be different from the order of decoding first, fourth, and seventh variable nodes VN11, VN14, and VN17 in the first iteration.

For example, the LDPC decoder 120 may perform decoding on the first variable node VN11 in the time period t10 to t11, may perform decoding on the fourth variable node VN14 in the time period t11 to t12, and may perform decoding on the seventh variable node VN17 in the time period t12 to t13. The LDPC decoder 120 may perform decoding on the fourth variable node VN14 in the time period t20 to t21, may perform decoding on the seventh variable node VN17 in the time period t21 to t22, and may perform decoding on the first variable node VN11 in the time period t22 to t23. The order of decoding the first, fourth, and seventh variable nodes VN11, VN14, and VN17 is not limited to the example described above, and is only for illustrative purpose.

In the first and second iterations, because decoding is not performed on all the variable nodes, the LDPC decoder 120 may not perform parity decoding that will be performed in the third and fourth iterations (omitting parity decoding). For example, the parity decoding may include at least one of quantization, syndrome computation, or decoding parameter control that are performed by the adaptive decoding controller 130 of FIG. 3.

In the third and fourth iterations, the LDPC decoder 120 may perform decoding on all the variable nodes (regardless of degrees of the variable nodes) and may perform the parity decoding based on a result of decoding the variable nodes. The LDPC decoder 120 may perform decoding on variable nodes having the same degree within consecutive time periods. In the third iteration of FIG. 11, the LDPC decoder 120 may perform decoding on the variable nodes VN12, VN15, and VN18 each having degree "4" (DV4) within consecutive time periods t33 to t34, t34 to t35, and t35 to t36.

For example, the LDPC decoder 120 may preferentially perform decoding on the variable nodes VN11, VN14, and VN17 each having degree "5" (DV5) being the highest degree in the time periods t30 to t31, t31 to t32, and t32 to t33 of the third iteration and the time periods t40 to t41, t41 to t42, and t42 to t43 of the fourth iteration and may firstly perform decoding on the variable nodes VN13 and VN16 each having degree "3" (DV3) being the lowest degree in the time periods t36 to t37 and t37 to t38 of the third iteration and the time periods t46 to t47 and t47 to t48 of the fourth iteration. The order of decoding variable nodes having the same degree may be decided by the principle described with reference to the first and second iterations. As decoding is selectively performed on variable nodes in a plurality of iterations, resource consumption necessary for decoding may be decreased, and quicker and more exact error correction may be possible.

FIG. 12 illustrates a memory system according to some example embodiments of inventive concepts. A memory system 1000 may include a memory controller 1100, the host 1200, and the memory device 1300. In some example embodiments, the memory system 1000 may be a computing system, which is configured to process various information, such as a personal computer (PC), a notebook, a laptop, a server, a workstation, a tablet PC, a smartphone, a digital camera, and/or a black box.

The memory controller 1100 may store data in the memory device 1300 or may read data stored in the memory device 1300. The memory device 1300 may operate under control of the memory controller 1100. A configuration of the memory controller 1100 will be more fully described with reference to FIG. 13.

The host 1200 may control overall operations of the memory system 1000. For example, the host 1200 may store data in the memory device 1300 and/or may read data stored in the memory device 1300. Under control of the host 1200, the memory device 1300 may store data or may provide the stored data to the host 1200.

In some example embodiments, the memory device 1300 may include a plurality of NAND flash memories each storing data. That is, the memory device 1300 may be a storage device having a plurality of NAND channels. However, inventive concepts is not limited thereto. For example, the memory device 1300 may be one of storage devices, which retain data stored therein even when a power is turned off, such as a phase-change random access memory (PRAM), a magnetic RAM (RRAM), and a ferroelectric RAM (FRAM).

Figure 13:
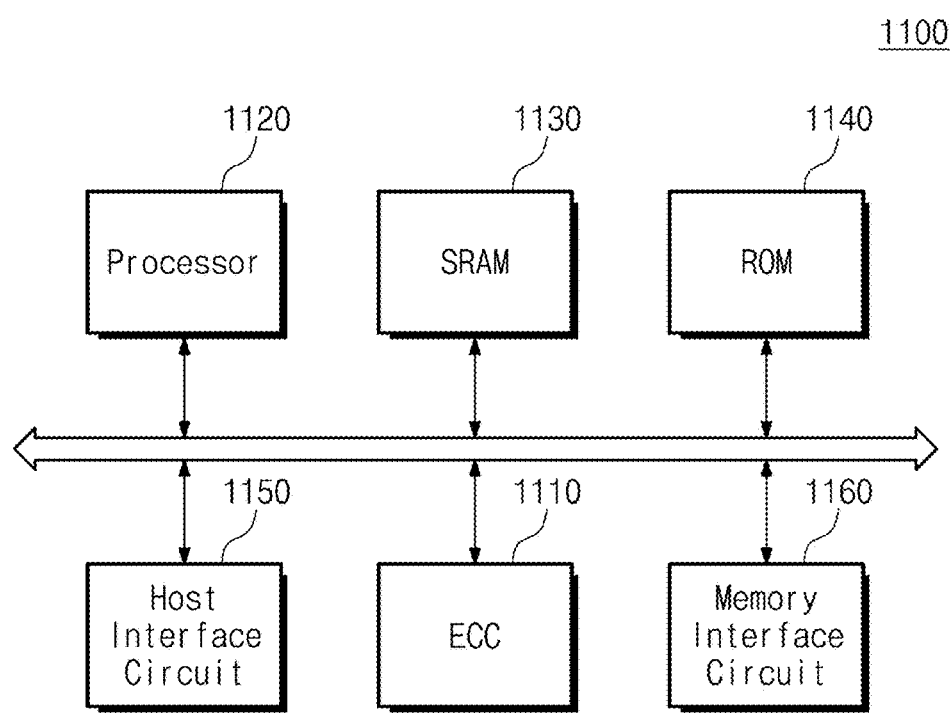
FIG. 13 illustrates a memory controller of FIG. 12 in detail.

FIG. 13 illustrates a memory controller of FIG. 12 in detail. The memory controller 1100 may include an error correction circuit (ECC) 1110, a processor 1120, a static random access memory (SRAM) 1130, a read only memory (ROM) 1140, a host interface circuit 1150, and a memory interface circuit 1160. The error correction circuit 1110 may be the error correction circuit 100 of FIG. 1 or 3.

The processor 1120 may control overall operations of the memory controller 1100. The SRAM 1130 may be used as a buffer memory, a cache memory, or a working memory of the memory controller 1100. The ROM 1140 may store a variety of information, which is necessary for the memory controller 1100 to operate, in the form of firmware. For example, the ROM 1140 may store an operating method of the error correction circuit 1110. The SRAM 1130 may store data that the error correction circuit 1110 outputs. The processor 1120 may output a command for controlling the error correction circuit 1110.

The memory controller 1100 may communicate with the memory device 1300 of FIG. 12 through the memory interface circuit 1160. In some example embodiments, the memory interface circuit 1160 may be implemented based on a NAND interface.

The memory controller 1100 may communicate with the host 1200 through the host interface circuit 1150. In some example embodiments, the host interface circuit 1150 may be implemented based on at least one of various interfaces such as a SATA (Serial ATA) interface, a PCIe (Peripheral Component Interconnect Express) interface, a SAS (Serial Attached SCSI) interface, an NVMe (Nonvolatile Memory express) interface, or an UFS (Universal Flash Storage) interface.

In example embodiments of inventive concepts described above, some components according to some example embodiments of inventive concepts are named and illustrated in the figures by using the terms "~er", "circuit", "circuitry", "node", or "block". The components named by using the terms may be implemented with various hardware devices, such as an integrated circuit (IC), an application specific IC (ASCI), a field programmable gate array (FPGA), or a complex programmable logic device (CPLD), firmware driven at the hardware devices, software such as an application executing on hardware, or a combination of a hardware device and software or may include circuits and/or an intellectual property (IP) implemented with semiconductor elements in the IC. The terms "~er", "circuit", "circuitry", "node", and "block" may be interchangeable and may be used to express such physical components.

An error correction circuit and an operating method thereof according to inventive concepts may be based on a Min-Sum method and may control a decoding operation depending on degrees of variable nodes when performing a sum operation, and thus, an error floor may be decreased.

While inventive concepts has been described with reference to example embodiments thereof, it will be apparent to those of ordinary skill in the art that various changes and modifications may be made thereto without departing from the spirit and scope of inventive concepts as set forth in the following claims.

What is claimed is:

1. An error correction circuit configured to perform error correction of data stored in a memory device, the error correction circuit comprising:
a memory configured to store at least one decoding parameter including a first graph-degree of a first variable node and a second graph-degree of a second variable node; and
a processing circuit storing the first variable node and the second variable node, wherein a first number of first check nodes connected to the first variable node is different from a second number of second check nodes connected to the second variable node,
wherein the processing circuit is configured:
to determine the first graph-degree and the second graph-degree according to the first number and the second number;
to determine a decoding rule for decoding of the data stored in the memory device, based on a combination of the first graph-degree and the second graph-degree; and
to output corrected data based on a decoding result.

2. The error correction circuit of claim 1, wherein the processing circuit further includes a variable node buffer storing the first variable node and the second variable node, and
wherein the processing circuit is further configured to receive the at least one decoding parameter from the memory and to update a value associated with the first variable node based on the at least one decoding parameter.

3. The error correction circuit of claim 2, wherein the variable node buffer stores a plurality of variable nodes including the first variable node and the second variable node, and
wherein the processing circuit is further configured to determine graph-degrees of the plurality of variable nodes based on the at least one decoding parameter and to determine the decoding rule for the decoding of the data further based on the graph-degrees of the plurality of variable nodes.

4. The error correction circuit of claim 3, wherein the processing circuit is further configured to determine an order of the first graph-degree of the first variable node from among the graph-degrees of the plurality of variable nodes, and to determine the decoding rule for the decoding of the data further based on the order.

5. The error correction circuit of claim 4, wherein the decoding rule is at least one of a sum-based rule or a lookup table-based rule.

6. The error correction circuit of claim 5, wherein, in response to the first graph-degree of the first variable node being the highest graph-degree of the graph-degrees of the plurality of variable nodes, the processing circuit is further configured to determine the decoding rule for the decoding of the data as the sum-based rule.

7. The error correction circuit of claim 1, wherein the processing circuit is further configured to receive the data from the memory device, the memory device being a NAND flash memory device.

8. A method for operating an error correction circuit which stores variable nodes having a first graph-degree value and variable nodes having a second graph-degree value different from the first graph-degree value, the method comprising:
performing decoding on the variable nodes having the first graph-degree value, in a first time period;
performing decoding on the variable nodes having the second graph-degree value, in a second time period following the first time period; and
outputting corrected data based on a decoding result corresponding to the variable nodes having the first graph-degree value and the variable nodes having the second graph-degree value, wherein the decoding result is determined based on a combination of the first graph-degree value and the second graph-degree value.

9. The method of claim 8, wherein the performing of the decoding on the variable nodes having the first graph-degree value in the first time period includes:
dividing the first time period into first to third sub-time periods when the variable nodes having the first graph-degree value are first to third variable nodes.

10. The method of claim 9, wherein the performing of the decoding on the variable nodes having the first graph-degree value in the first time period further includes:
comparing values of the first to third variable nodes; and
based on a result of comparing the values of the first to third variable nodes, performing decoding on the first variable node in the first sub-time period, performing decoding on the second variable node in the second sub-time period, and performing decoding on the third variable node in the third sub-time period.

11. The method of claim 8, further comprising:
calculating an error rate based on the decoding result after the decoding in the second time period is completed; and
completing an error correction in response to the error rate being smaller than a value.

12. The method of claim 11, further comprising:
repeating decoding on the variable nodes having the first graph-degree value in a third time period following the second time period, in response to the error rate being greater than the value.

13. The method of claim 8, wherein the first graph-degree value is greater than the second graph-degree value.

14. The method of claim 8, wherein the outputting of the corrected data based on the decoding result corresponding to the variable nodes having the first graph-degree value and the variable nodes having the second graph-degree value decoding includes performing a parity decoding including at least one of quantization, syndrome computation, or decoding parameter control.

15. A method for operating an error correction circuit which includes variable nodes having a first graph-degree value and variable nodes having a second graph-degree value different from the first graph-degree value, the method comprising:
performing decoding on the variable nodes having the first graph-degree value, in a first iteration;
performing decoding on the variable nodes having the second graph-degree value, in a second iteration following the first iteration; and
outputting corrected data based on a first decoding result corresponding to the variable nodes having the first graph-degree value and the variable nodes having the second graph-degree value, wherein the first decoding result is determined based on a combination of the first graph-degree value and the second graph-degree value.

16. The method of claim 15, further comprising:
calculating an error rate based on the first decoding result after the decoding in the second iteration is completed; and
completing an error correction when the error rate is less than a value.

17. The method of claim 15, wherein the first graph-degree value is greater than the second graph-degree value.

18. The method of claim 17, further comprising:
performing decoding on the variable nodes having the first graph-degree value, in the second iteration.

19. The method of claim 15, wherein the error correction circuit further includes variable nodes having a third graph-degree value smaller than the second degree value,
the method further comprises:
performing decoding on the variable nodes having the first graph-degree value, the variable nodes having the second graph-degree value, and the variable nodes having the third graph-degree value, in a third iteration following the second iteration; and
outputting corrected data based on a second decoding result corresponding to the variable nodes having the first graph-degree value, the variable nodes having the second graph-degree value, and the variable nodes having the third graph-degree value, wherein the second decoding result is determined based on a combination of the first graph-degree value, the second graph-degree value, and the third graph-degree value.

20. The method of claim 15, wherein the outputting of the corrected data based on the first decoding result corresponding to the variable nodes having the first graph-degree value and the variable nodes having the second graph-degree value includes performing a parity decoding including at least one of quantization, syndrome computation, or decoding parameter control.

* * * * *